United States Patent [19]

Song

[11] Patent Number: 5,554,886
[45] Date of Patent: Sep. 10, 1996

[54] LEAD FRAME AND SEMICONDUCTOR PACKAGE WITH SUCH LEAD FRAME

[75] Inventor: Chi J. Song, Daejon, Rep. of Korea

[73] Assignee: Goldstar Electron Co., Ltd., Choongchungbook-D, Rep. of Korea

[21] Appl. No.: 384,988

[22] Filed: Feb. 7, 1995

[30] Foreign Application Priority Data

Mar. 30, 1994 [KR] Rep. of Korea .................. 6579/1994

[51] Int. Cl.⁶ .................................................. H01L 23/495
[52] U.S. Cl. ........................ 257/666; 257/677; 257/686
[58] Field of Search .......................... 257/666, 669, 257/677, 686, 676, 750

[56] References Cited

U.S. PATENT DOCUMENTS 5,134,459  7/1992  Maeda et al. ..................... 257/677
5,410,180  4/1995  Fujii et al. ....................... 257/666

FOREIGN PATENT DOCUMENTS 5-129514  5/1993  Japan ............................ 257/666.2

Primary Examiner—William Mintel
Assistant Examiner—Roy Potter
Attorney, Agent, or Firm—Lowe, Price, LeBlanc & Becker

[57] ABSTRACT

A lead frame and a semiconductor package produced using the lead frame are disclosed. The lead frame has a plurality of multi-layered inner leads, each of the multi-layered inner leads having at least two different metal layers joined to each other. An outer lead is formed by an extension part of at least one of the different metal layers of each of the multi-layered inner leads. The semiconductor package includes a semiconductor chip, the lead frame and a package body hermetically packaging a predetermined volume including the semiconductor chip, the multi-layered inner leads of the lead frame and a plurality of metal wires. The lead frame is free from chip paddle, thus to improve operational reliability of the package. The semiconductor package with the lead frame is readily enlarged in its memory capacity and mounted on the surface of a PCB in various mounting types.

12 Claims, 5 Drawing Sheets

5,554,886

LEAD FRAME AND SEMICONDUCTOR PACKAGE WITH SUCH LEAD FRAME

BACKGROUND OF THE INVENTION

1. Field of the Invention

The present invention relates in general to a lead frame and a semiconductor package with such a lead frame and, more particularly, to a structural improvement in such a lead frame for removing a chip paddle from the lead frame but forming inner leads as well as outer leads of the lead frame using different metals, thereby improving operational reliability of a semiconductor package, and to a semiconductor package produced using such a lead frame.

2. Description of the Prior Art

With reference to FIG. 1, there is shown a typical lead frame for a semiconductor package. In the drawing, the reference numeral 2 denotes a chip paddle which is placed in the center of the lead frame between a pair of side rails 1 and 1a and held by a pair of tie bars 3. The paddle 2 will hold a semiconductor chip 10 thereon in a semiconductor package as shown in FIG. 2. The lead frame also includes a plurality of inner leads 4 radially extending about the paddle 2, which inner leads 4 will be electrically connected to a plurality of pads of the semiconductor chip 10 by means of a plurality of metal wires 13 respectively, which metal wires 13 will be bonded to the pads of the chip 10 and to the inner leads 4 at their opposed ends. Extending outward from the inner leads 4 are a plurality of outer leads 5, which outer leads 5 are connected to each other by means of dambars 6 crossing the outer leads 5 and will be mounted on the surface of a PCB (printed circuit board, not shown) when surface-mounting the package on the PCB. The above lead frame acts as a chip holder for holding the semiconductor chip 10 thereon, as an electric passage for transmitting signals relative to the chip 10 and as a thermal passage for radiating the heat evolved from the semiconductor chip 10 to the outside of the package.

FIG. 2 is a sectional view of a semiconductor package produced using the above lead frame. As shown in this drawing, the semiconductor chip 10 is fixedly attached, using a die attaching epoxy such as a thermosetting bonder 15, to the top surface of the paddle 2 of the lead frame 11 made of copper. The pads of the chip 10 are electrically connected to the inner leads 4 of the lead frame 11 by means of the metal wires 13 respectively. A predetermined volume including the chip 10, the inner leads 4 and the metal wires 13 is hermetically packaged using an epoxy molding compound, thus to form a package body 14. In this case, the outer leads 5 of the lead frame 11 extend to the outside of the package body 14 at opposed sides of the body 14. The above semiconductor package is mounted to the surface of the PCB (not shown) by mounting the outer leads 5 to the surface of the PCB.

In order to produce the above semiconductor package, a sawing step is primarily carried out for dividing a semiconductor wafer (not shown) into a plurality of semiconductor chips 10. The sawing step is followed by a die attaching step in which one of the semiconductor chips 10 is fixedly attached to the paddle 2 of the copper lead frame 11 using the thermosetting bonder 15. The lead frame 11 having the semiconductor chip 10 is, thereafter, cured for a predetermined time prior to a wire bonding step. In the wire bonding step, the pads of the chip 10 on the paddle 2 are electrically connected to the inner leads 4 of the lead frame 11 by means of the plurality of metal wires 13 respectively. The wire bonding step is followed by a package molding step. In the package molding step, the predetermined volume including the semiconductor chip 10, the inner leads 4 and the metal wires 13 is hermetically packaged using the epoxy molding compound, thus to form the package body 14. After forming the package body 14, the lead frame 11 packaged by the package body 14 is subjected to curing for a predetermined time in order for curing the package body 14. Thereafter, a trimming step is carried out for cutting the tie bars 3 of the lead frame 11 and for cutting the dambars 6, which dambars 6 have maintained the inner and outer leads 4 and 5 of the lead frame 11 in their places relative to the side rails 1 and 1a, thus to electrically separate each inner lead 4 and an associated outer lead 5 from the other inner and outer leads 4 and 5. The trimming step is followed by a forming step for forming the outer leads 5 into a predetermined configuration. The process for producing the above package of FIG. 2 is ended at a plating step. The semiconductor package produced through the above process is, thereafter, subjected to a performance test prior to surface mounting of the package on the PCB. The package mounted on the surface of the PCB outputs and inputs electric signals from and to the semiconductor chip 10 through the lead frame 11.

As described above, the typical lead frame 11 of the semiconductor package has the chip paddle 2 for holding the semiconductor chip 10 thereon, so that the package has a problem that it may have chip crack as well as interfacial separation due to difference of thermal expansion coefficient between the paddle 2, the chip 10 and the epoxy molding compound of the package body 14. In addition, as the volume ratio of the semiconductor chip 10 to the total volume defined by the package body 14 has been enlarged due to the recent tendency that the size of semiconductor chips has been enlarged more and more, the volume ratio of the package body 14 has been reduced. In this regard, the trimming step may cause a crack in the package body 14 made of the molding compound as well as cause a chip crack.

Furthermore, the typical lead frame 11 of the package is made of a single material or copper, so that the package inevitably suffers from deterioration due to the single material of the lead frame 11. Another problem of the above package is resided in that a plurality of packages can not be vertically layered even when the packages need to be layered in order to enlarge the memory capacity. The outer leads 5 of the lead frame 11 of the package have the downward extending configuration as shown in FIG. 2, so that the package inevitably wastes the space when the package is mounted on the surface of the PCB.

SUMMARY OF THE INVENTION

It is, therefore, an object of the present invention to provide a lead frame in which the above problems can be overcome and which has no chip paddle but comprises multi-layered inner leads and outer leads, each of which inner leads is formed by joining different metal layers, that is, at least two metal layers having different thermal expansion coefficients, to each other through a cold rolling method, and each of which outer leads is formed by an extension part of at least one of the different metal layers of the inner leads, so that the lead frame improves operational reliability of a semiconductor package.

It is another object of the present invention to provide a semiconductor package produced using the above lead frame, which package is readily enlarged in its memory capacity and mounted on the surface of a PCB in various mounting types, thus to diversify package mounting type on the PCB.

In an aspect, the present invention provides a lead frame for a semiconductor package comprising: a plurality of multi-layered inner leads, each of the multi-layered inner leads including at least two different metal layers joined to each other; and an outer lead formed by an extension part of at least one of the different metal layers of each of the multi-layered inner leads.

In another aspect, the present invention provides a semiconductor package comprising: a semiconductor chip; a lead frame holding the semiconductor chip thereon and acting as a signal transmitting passage for the chip, the lead frame having: a plurality of multi-layered inner leads, each of the multi-layered inner leads including at least two different metal layers joined to each other; and an outer lead formed by an extension part of at least one of the different metal layers of each of the multi-layered inner leads; and a package body hermetically packaging a predetermined volume including the semiconductor chip and the multi-layered inner leads of the lead frame.

BRIEF DESCRIPTION OF THE DRAWINGS

Other objects and aspects of the invention will become apparent from the following description of embodiments with reference to the accompanying drawings in which.

DESCRIPTION OF THE PREFERRED EMBODIMENTS

Figure 1:
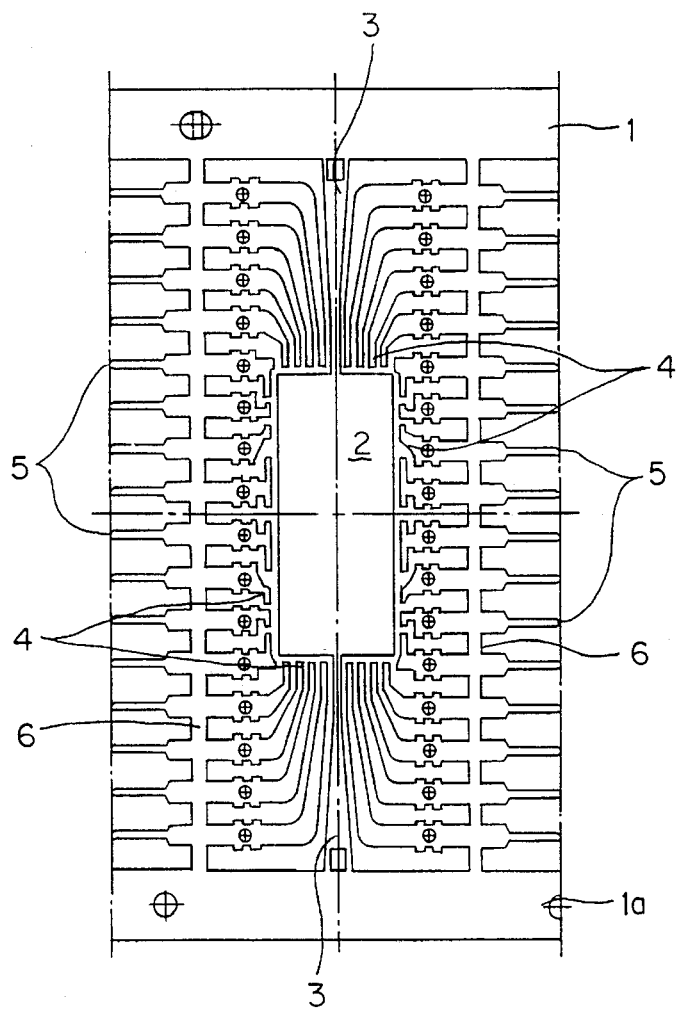
FIG. 1 is a plan view a typical lead frame for a semiconductor package.
Figure 2:
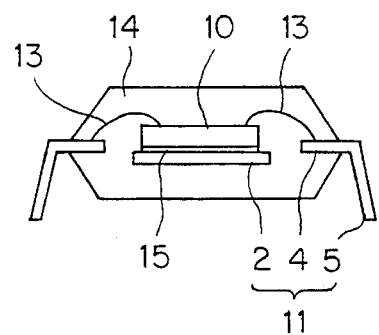
FIG. 2 is a sectional view of a semiconductor package produced using the lead frame of FIG. 1.
Figure 3A:
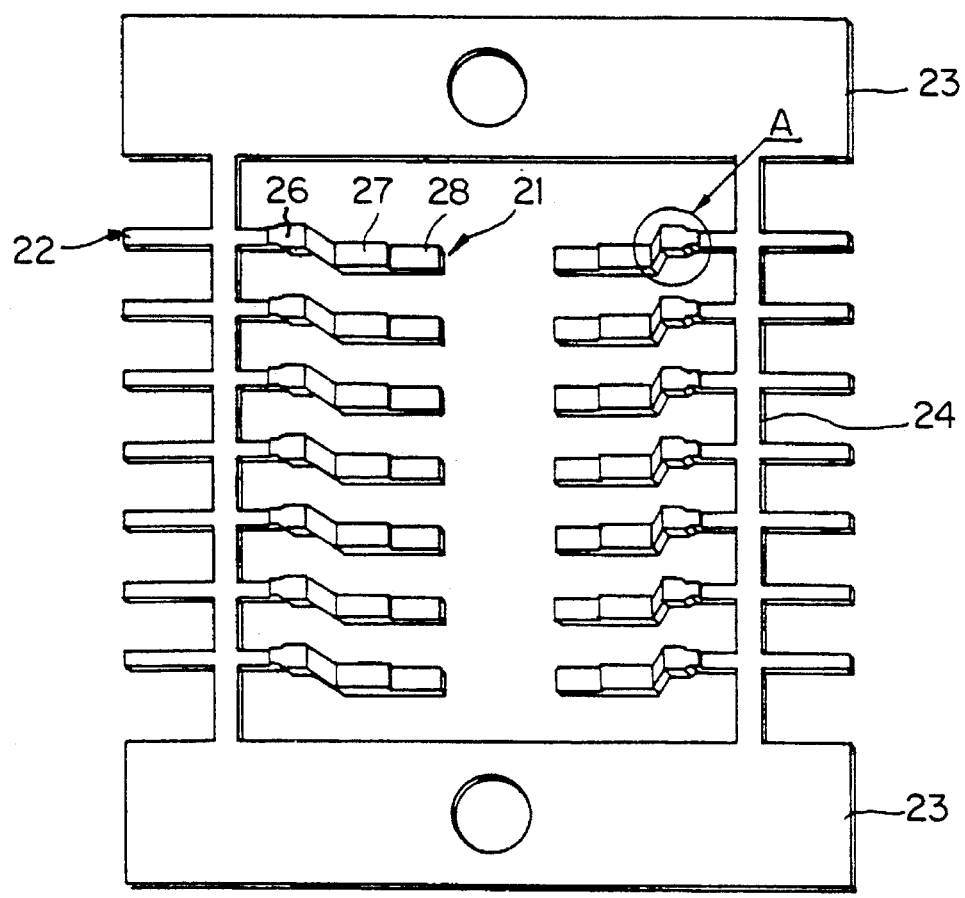
FIG. 3A is a perspective view of a lead frame in accordance with a first embodiment of the invention.
Figure 3B:
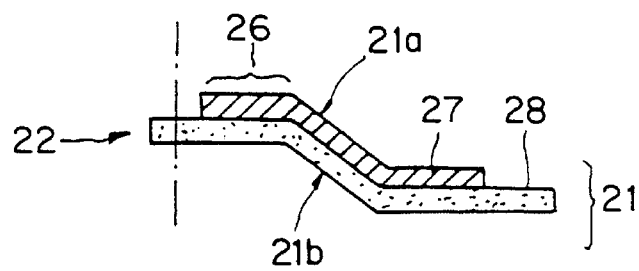
FIG. 3B is an enlarged sectional view of the encircled portion A of FIG. 3A, showing structures of inner and outer leads of the lead frame.

FIG. 3A is a perspective view of a lead frame in accordance with a first embodiment of the invention, and FIG. 3B is an enlarged sectional view of the encircled portion A of FIG. 3A, showing structures of inner and outer leads of the lead frame.

As shown in the drawings, the lead frame of the first embodiment includes a plurality of multi-layered or double-layered inner leads 21, each of which inner leads 21 comprises a first metal layer 21a and a second metal layer 21b joined to each other. The lead frame also includes a plurality of outer leads 22 which are formed by extension parts of the second metal layers 21b of the inner leads 21 respectively and are connected to each other by dambars 24 which cross the outer leads 22. The first and second metal layers 21a and 21b of each inner lead 21 are made of different metals having different thermal expansion coefficients and joined to each other so as to form each multi-layered inner lead 21 having at least two metal layers.

Figure 7:
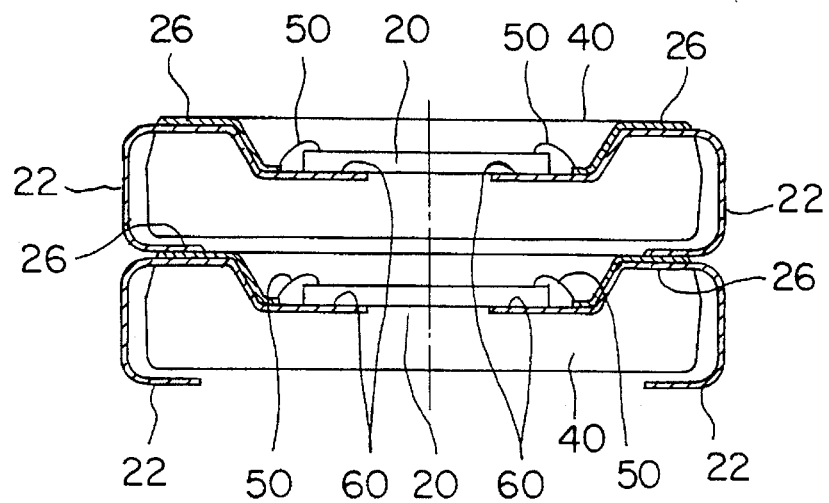

As best seen in FIG. 3B, the inside section of the first metal layer 21a of each inner lead 21 forms a connection part 27 at which each inner lead 21 will be electrically connected to an associated pad of a semiconductor package (not shown). The outside section of the first metal layer 21a of each inner lead 21 forms an exposure part 26 which will be exposed to the outside of a package body (not shown) of a semiconductor package when the lead frame having the semiconductor chip is packaged using epoxy molding compound into the package. The exposure part 26 will be electrically connected to an outer terminal, for example, an outer lead, of another package when vertically layering a plurality of packages in order for enlarging the memory capacity as shown in FIG. 7. Meanwhile, the inside end section of the second metal layer 21b of each inner lead 21 forms a chip mount part 28 for mounting and holding the semiconductor chip thereon. As shown in FIG. 3B, there is provided a step between the connection part 27 of the first metal layer 21a of each inner lead 21 and the chip mount part 28 of the second metal layer 21b of each inner lead 21. In the first embodiment of the invention, the first metal layers 21a of the inner leads 21 are made of a metal, for example, alloy-42 (42% Ni), having a thermal expansion coefficient lower than that of copper, while the second metal layers 21b of the inner leads 21 as well as the outer leads 22 are made of copper. Of course, it should be understood that the above metals for the lead frame may be exchanged for each other without affecting the functioning of the invention.

As shown in FIG. 3B, each inner lead 21 is bent into a predetermined bent configuration in that the position of the exposure part 26 of each inner lead 21 is higher than that of the chip mount part 28 of the inner lead 21. The inner and outer leads 21 and 22 are kept in their places in the lead frame by the dambars 24 extending between a pair of side rails 23 as shown in FIG. 3A.

Figure 4A:
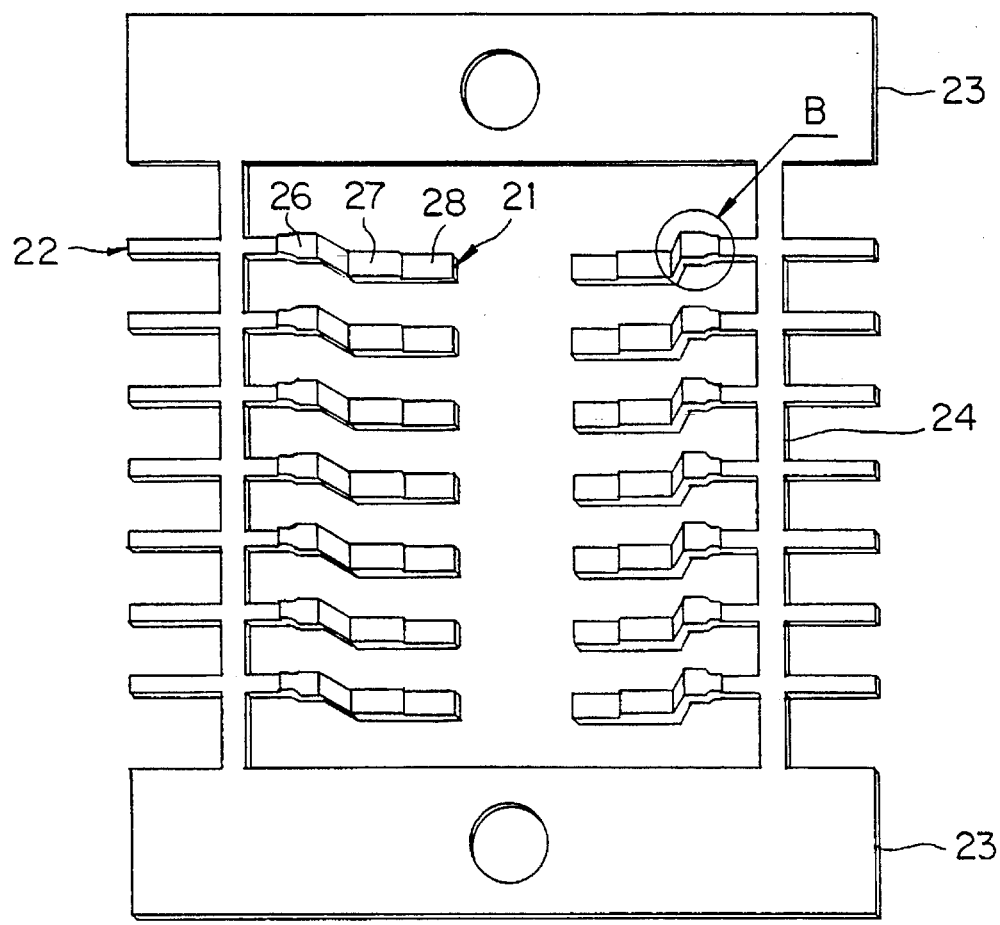
FIG. 4A is a perspective view of a lead frame in accordance with a second embodiment of the invention.
Figure 4B:
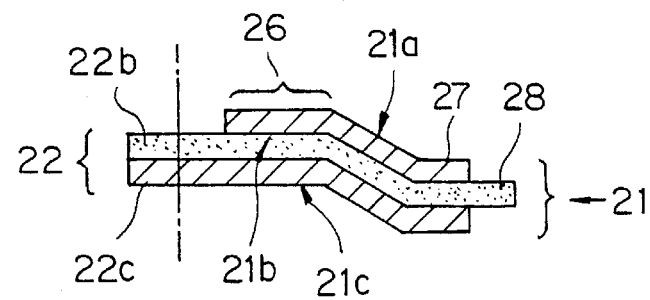
FIG. 4B is an enlarged sectional view of the encircled portion B of FIG. 4A, showing structures of inner and outer leads of the lead frame.

Turning to FIGS. 4A and 4B, there is shown a lead frame in accordance with a second embodiment of the invention. FIG. 4A is a perspective view of the lead frame, and FIG. 4B is an enlarged sectional view of the encircled portion B of FIG. 4A, showing structures of inner and outer leads of the lead frame.

As shown in FIG. 4A, the lead frame of the second embodiment is similar to the lead frame of the first embodiment in view of that the inner leads 21 are formed by joining different metals having different thermal expansion coefficients to each other and the outer leads 22 are formed by outward extension parts of the inner leads 21. However, the lead frame of the second embodiment differs from the lead frame of the first embodiment in the lead layering type or the number of metal layers as will be described hereinbelow, referring to FIG. 4B.

Figure 10:
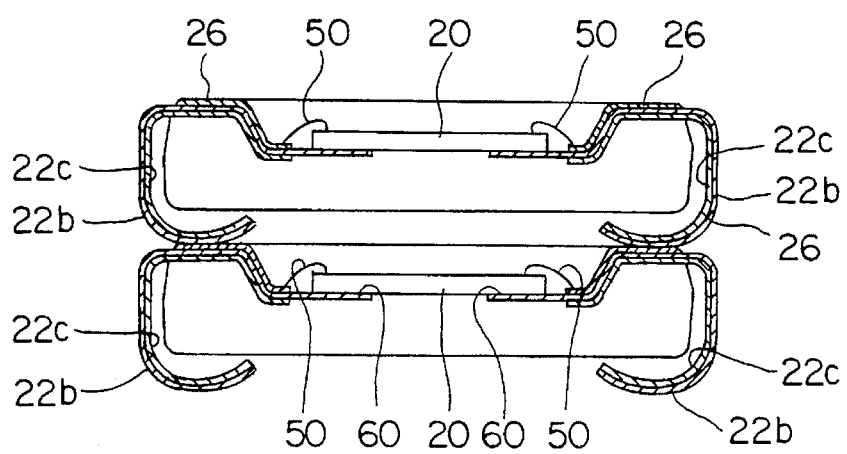

As shown in FIG. 4B, the lead frame of the second embodiment has triple-layered inner leads 21. In each triple-layered inner lead 21, a first metal layer 21a forms the top layer of each inner lead 21. In the same manner as described for the first embodiment, the inside section of the first metal layer 21a forms a connection part 27 at which each inner lead 21 will be electrically connected to an associated pad of a semiconductor package (not shown). The outside section of the first metal layer 21a forms an exposure part 26 which will be exposed to the outside of a package body (not shown)

of a semiconductor package when the lead frame having the semiconductor chip is packaged using epoxy molding compound into the package. The exposure part 26 will be electrically connected to an outer terminal, for example, an outer lead, of another package when vertically layering a plurality of packages for enlarging the memory capacity as shown in FIG. 10. In each triple-layered inner lead 21, a second metal layer 21b forms the middle layer of each inner lead 21. The inside end section of the second metal layer 21b of each inner lead 21 forms a chip mount part 28 for mounting and holding the semiconductor chip thereon. The bottom layer of each triple-layered inner lead 21 is a third metal layer 21c. That is, the third metal layer 21c is joined to the bottom surface of the second metal layer 21b.

In the second embodiment, the first metal layers 21a of the inner leads 21 are exclusively positioned inside the dambars 24, while the second and third metal layers 21b and 21b of the inner leads 21 extend over the dambars 24. In addition, first and second metal layers 22b and 22c of each double-layered outer lead 22 are formed by extension parts of the second and third metal layers 21b and 21c of an associated triple-layered inner lead 21. Please noted that size and length of the connection parts 27 of the first metal layers 21a of the inner leads 21 as well as size and length of the chip mount parts 28 of the second metal layers 21b of the inner leads 21 may be changed in accordance with size and configuration of the semiconductor chip which will be used with the lead frame.

In the second embodiment of the invention, the first metal layers 21a and the third metal layers 21c of the inner leads 21 as well as the second metal layers 22c of the outer leads 22 are made of a metal, for example, alloy-42 (42% Ni), having a thermal expansion coefficient lower than that of copper, while the second metal layers 21b of the inner leads 21 and the first metal layers 22b of the outer leads 22 are made of copper. Of course, it should be understood that the metals for the lead frame may be not limited to the above-mentioned metals, for example, the above metals may be exchanged for each other without affecting the functioning of the invention.

Each of the lead frames according to the first and second embodiments of the invention has no chip paddle for mounting the semiconductor chip thereon, so that each lead frame has a simple construction. In forming the multi-layered inner leads, each inner lead is not formed by a single material but formed by joining different metals having different thermal expansion coefficients, for example, copper having good electric conductivity and alloy-42 (42% Ni) having a thermal expansion coefficient similar to that of the epoxy molding compound for the package body, to each other through a conventional cold rolling method. After joining the two metals to each other, the metal layer made of the alloy-42 is partially etched using photoresist mask applied on the alloy-42 layer. The lead frame, after the partial etching of the alloy-42 layer, is down set. Therefore, the present invention provides a lead frame having no difference of thermal expansion coefficient between the lead frame and the molding compound of the package body but having a good electric conductivity. As there is no difference of thermal expansion coefficient between the lead frame and the molding compound, there is generated neither chip crack nor interfacial separation in the package of the invention.

Figure 5:
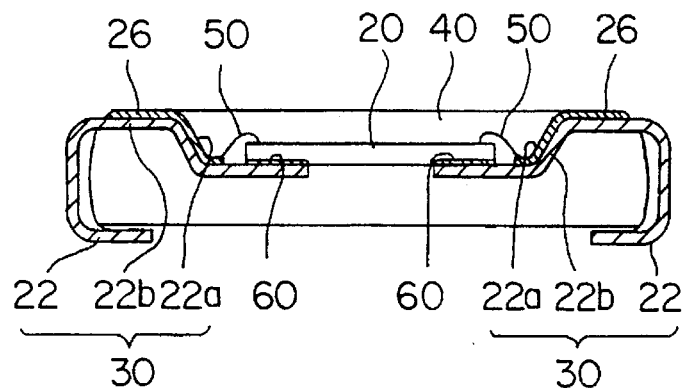
FIG. 5 to 7 are sectional views of semiconductor packages produced using the lead frames of the first embodiment of the invention respectively.
Figure 6:
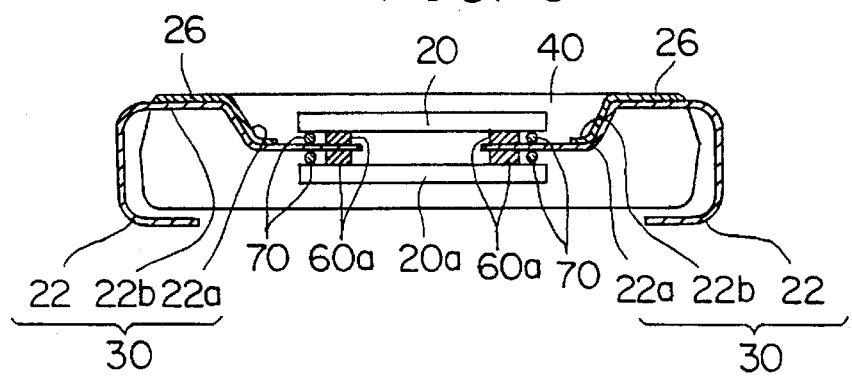

Turning to FIGS. 5 to 7, there are shown semiconductor packages produced using the lead frames of the first embodiment of the invention respectively.

In order to produce the package of the FIG. 5, a semiconductor chip 20 is attached to the top surfaces of the chip mount parts 28 of the second metal layers 21b of the double-layered inner leads 21 using die attaching means 60 such as die attaching paste or insulating double-faced tapes. Thereafter, the pads of the semiconductor chip 20 are electrically connected to the connection parts 27 of the first metal layers 21a of the inner leads 21 by means of a plurality of metal wires 50. A predetermined volume including the semiconductor chip 20, the first and second metal layers 21a and 21b of the inner leads 21 and the metal wires 50 is packaged using the epoxy molding compound, thus to form a package body 40. At this time, the exposure parts 26 of the inner leads 21 as well as the outer leads 22 of the lead frame 30 are exposed to the opposed top sides of the package body 40. After molding the package body 40, the outer leads 22 exposed to the outside of the package body 40 are formed into a predetermined bent shape suitable for mounting of the package on the PCB (not shown).

The exposure parts 26 formed on the outside sections of the first metal layers 21a of the inner leads 21 are exposed to the outside of the package body 40 of the semiconductor package. The exposure parts 26 are used as electric connection terminals when a plurality of packages are vertically layered in order for enlarging the memory capacity as shown in FIG. 7. That is, the exposure parts 26 of the lead frame 30 are electrically connected to their associated outer terminals, for example, the outer leads 22, of another package when vertically layering the packages for enlarging the memory capacity.

In the semiconductor package of FIG. 6, a plurality of or two semiconductor chips 20 and 20a are attached, using die attaching tapes 60a and bumps 70, to the top surfaces and to the bottom surfaces of the chip mount parts 28 (see FIG. 3B) of the inner leads 21 respectively.

In order to produce the package of FIG. 6, the chip mount parts 28 of the second metal layers 21b of the inner leads 21 of the lead frame 30 are lengthened and applied with double-faced tapes 60a on the top and bottom surfaces thereof respectively. In addition, the plurality of bumps 70 for electrically connecting the semiconductor chips 20 and 20a to the inner leads 21 are formed on the top and bottom surfaces of the chip mount parts 28 of the second metal layers 21b respectively such that the bumps 70 are spaced apart from their associated double-faced tapes 60a by a distance. After forming the bumps 70, the two semiconductor chips 20 and 20a are attached to the top and bottom surfaces of the chip mount parts 28 of the inner leads 21 respectively. If briefly described, the semiconductor package of FIG. 6 is provided with two semiconductor chips 20 and 20a, which chips 20 and 20a are attached to the top and bottom surfaces of the chip mount parts 28 of the inner leads 21 using the double-faced tapes 60a as well as the bumps 70 in order for enlarging the memory capacity of the package.

The other steps, except for the above steps, of the process for producing the package of FIG. 6 remain the same as those described for the package of FIG. 5 and further explanation for the other steps is thus not deemed necessary.

FIG. 7 shows a plurality of or two semiconductor packages produced using the lead frames of the first embodiment, which packages are vertically layered in order for enlarging the memory capacity. As schematically described in the package of FIG. 5, the outer leads 22 of the packages of FIG. 7 are bent into the predetermined shape. In vertically layering the packages, the packages are not provided with additional terminals for electrically connecting the packages to each other but use the exposure parts 26 for electrically connecting the packages to each other. That is, the outer leads 22 of the top package are electrically connected to their associated exposure parts 26 of the bottom package.

Figure 8:
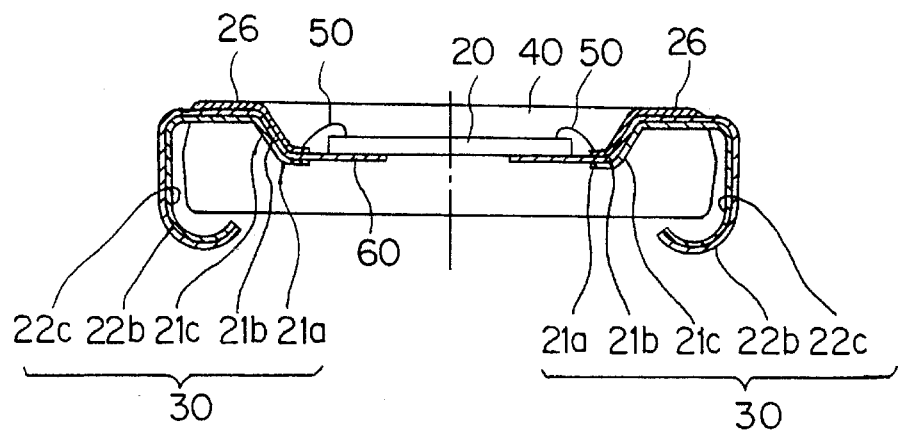
FIGS. 8 to 10 are sectional views of semiconductor packages produced using the lead frames of the second embodiment of the invention respectively.
Figure 9:
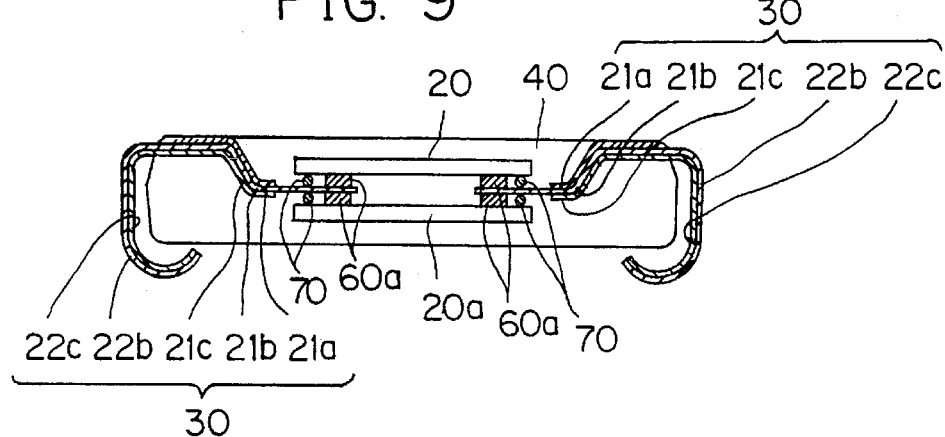

FIGS. 8 to 10 are sectional view of semiconductor packages produced using the lead frames of the second embodiment of the invention respectively.

In order to produce the package of the FIG. 8, a semiconductor chip 20 is attached to the top surfaces of the chip mount parts 28 of the second metal layers 21b of the triple-layered inner leads 21 using die attaching means 60 such as die attaching paste or insulating double-faced tapes. Thereafter, the pads of the semiconductor chip 20 are electrically connected to the connection parts 27 of the first metal layers 21a of the inner leads 21 by means of a plurality of metal wires 50. A predetermined volume including the semiconductor chip 20, the first to third metal layers 21a to 21c of the inner leads 21 and the metal wires 50 is packaged using the epoxy molding compound, thus to form a package body 40. At this time, the exposure parts 26 of the first metal layers 21a of the inner leads 21 and the first and second outer leads 22b and 22c of the outer leads 22 are exposed to the opposed top sides of the package body 40. After molding the package body 40, the outer leads 22 having the first and second metal layers 22b and 22c are formed into a predetermined bent shape suitable for surface mounting of the package on the PCB (not shown).

The exposure parts 26 formed on the outside sections of the first metal layers 21a are exposed to the outside of the package body 40 of the semiconductor package. The exposure parts 26 are used as electric connection terminals when a plurality of packages are vertically layered in order for enlarging the memory capacity as shown in FIG. 10. That is, the exposure parts 26 of the lead frame 30 are electrically connected to their associated outer terminals, for example, the first metal layers 22b of outer leads 22, of another package when vertically layering the packages for enlarging the memory capacity.

In the semiconductor package of FIG. 9, a plurality of or two semiconductor chips 20 and 20a are attached, using die attaching tapes 60a and bumps 70, to the top surfaces and to the bottom surfaces of the chip mount parts 28 (see FIG. 4B) of the second metal layers 21b of the inner leads 21 respectively.

In order to produce the package of FIG. 9, the chip mount parts 28 of the second metal layers 21b of the inner leads 21 of the lead frame 30 are lengthened and applied with double-faced tapes 60a on the top and bottom surfaces thereof respectively. In addition, the plurality of bumps 70 for electrically connecting the semiconductor chips 20 and 20a to the inner leads 21 are formed on the top and bottom surfaces of the chip mount parts 28 respectively such that the bumps 70 are spaced apart from their associated double-faced tapes 60a by a distance. After forming the bumps 70, the two semiconductor chips 20 and 20a are attached to the top and bottom surfaces of the chip mount parts 28 of the inner leads 21 respectively. If briefly described, the semiconductor package of FIG. 9 is provided with two semiconductor chips 20 and 20a, which chips 20 and 20a are attached to the top and bottom surfaces of the chip mount parts 28 of the inner leads 21 using the double-faced tapes 60a as well as the bumps 70 in order for enlarging the memory capacity of the package.

The other steps, except for the above steps, of the process for producing the package of FIG. 9 remain the same as those described for the package of FIG. 8 and further explanation for the other steps is thus not deemed necessary.

FIG. 10 shows a plurality of or two semiconductor packages produced using the lead frames of the second embodiment, which packages are vertically layered in order for enlarging the memory capacity. As schematically described in the package of FIG. 8, the outer leads 22 of the packages of FIG. 10 are bent into the predetermined shape. In vertically layering the packages, the packages are not provided with additional terminals for electrically connecting the packages to each other but use the exposure parts 26 for electrically connecting the packages to each other. That is, the outer leads 22 of the top package are electrically connected to their associated exposure parts 26 of the bottom package.

As described above, a lead frame of the present invention has no chip paddle, thus to increase the volume ratio of the molding compound to the total volume defined by the package body and to prevent possible crack in the package body and a chip crack. Furthermore, the inner and outer leads of the lead frame have multi-layered structures formed by joining leads made of different metals having different thermal expansion coefficients to each other, thus to increase the electric conductivity of the lead frame and to improve operational reliability of a semiconductor package.

In the semiconductor package produced using the lead frame of the invention, an exposure part acting as an outer lead is formed on an extension part of a first metal layer of each multi-layered inner lead of the lead frame. The exposure parts of the first metal layers of the inner leads are used as electric terminals when vertically layering a plurality of packages, so that the packages of the invention are readily layered vertically in order for enlarging the memory capacity. Furthermore, the package of the invention is mounted on the surface of a PCB in various mounting types, thus to diversify package mounting type on the PCB.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A lead frame for a semiconductor package comprising:

a plurality of multi-layered inner leads, each of said multi-layered inner leads including at least two different metal layers joined directly to each other; and an outer lead formed by an extension part of at least one of the different metal layers of each of said multi-layered inner leads, wherein each of said multi-layered inner leads comprises:

a first metal layer having a chip connection part at a first end thereof for electrically connecting each said inner lead to a semiconductor chip, and having an exposure part at a second end thereof for use as an electric connection terminal when vertically layering a plurality of packages; and a second metal layer joined to the bottom surface of said first metal layer and having a first end extending beyond the first end of the first metal layer to form a step between the first end of the first metal layer and the first end of the second metal layer, said second metal layer having a chip mount part for mounting the semiconductor chip thereon at the first end thereof.

2. The lead frame according to claim 1, wherein said first metal layer is made of alloy-42 (42% Ni), while said second metal layer is made of copper.

3. The lead frame according to claim 1, wherein said first metal layer is made of copper, while said second metal layer is made of alloy-42 (42% Ni).

4. A lead frame for a semiconductor package comprising:

a plurality of multi-layered inner leads, each of said multi-layered inner leads including at least two different metal layers joined directly to each other; and an outer lead formed by an extension part of at least one of the different metal layers of each of said multi-layered inner leads, wherein each of said multi-layered inner leads comprises:

a first metal layer having a chip connection part at a first end thereof for electrically connecting each said inner lead to a semiconductor chip, and having an exposure part at a second end thereof for use as an electric connection terminal when vertically layering a plurality of packages;

a second metal layer joined to the bottom surface of said first metal layer and having a first end extending beyond the first end of the first metal layer to form a step between the first end of the first metal layer and the first end of the second metal layer, said second metal layer having a chip mount part for mounting the semiconductor chip thereon at the first end thereof; and a third metal layer joined to the bottom surface of said second metal layer.

5. The lead frame according to claim 4, wherein said first and third metal layers are made of alloy-42 (42% Ni), while said second metal layer is made of copper.

6. The lead frame according to claim 4, wherein said first and third metal layers are made of copper, while said second metal layer is made of alloy-42 (42% Ni).

7. A semiconductor package comprising:

a semiconductor chip;

a lead frame holding the semiconductor chip thereon and acting as a signal transmitting passage for said chip, said lead frame having:

a plurality of multi-layered inner leads, each of said multi-layered inner leads including at least two different metal layers joined directly to each other; and an outer lead formed by an extension part of at least one of the different metal layers of each of said multi-layered inner leads; and a package body hermetically packaging a predetermined volume including said semiconductor chip and said multi-layered inner leads of the lead frame, wherein each of said multi-layered inner leads comprises:

a first metal layer having a chip connection part at a first end thereof for electrically connecting each said inner lead to said semiconductor chip, and having an exposure part at a second end thereof for use as an electric connection terminal when vertically layering a plurality of packages; and a second metal layer joined to the bottom surface of said first metal layer and having a first end extending beyond the first end of the first metal layer to form a step between the first end of the first metal layer and the first end of the second metal layer, said second metal layer having a chip mount part for mounting the semiconductor chip thereon at the first end thereof.

8. The lead frame according to claim 7, wherein said first metal layer is made of alloy-42 (42% Ni), while said second metal layer is made of copper.

9. The lead frame according to claim 7, wherein said first metal layer is made of copper, while said second metal layer is made of alloy-42 (42% Ni).

10. A semiconductor package comprising:

a semiconductor chip;

a lead frame holding the semiconductor chip thereon and acting as a signal transmitting passage for said chip, said lead frame having:

a plurality of multi-layered inner leads, each of said multi-layered inner leads including at least two different metal layers joined directly to each other; and an outer lead formed by an extension part of at least one of the different metal layers of each of said multi-layered inner leads; and a package body hermetically packaging a predetermined volume including said semiconductor chip and said multi-layered inner leads of the lead frame, wherein each of said multi-layered inner leads comprises:

a first metal layer having a chip connection part at a first end thereof for electrically connecting each said inner lead to said semiconductor chip, and having an exposure part at a second end thereof for use as an electric connection terminal when vertically layering a plurality of packages;

a second metal layer joined to the bottom surface of said first metal layer and having a first end extending beyond the first end of the first metal layer to form a step between the first end of the first metal layer and the first end of the second metal layer, said second metal layer having a chip mount part for mounting the semiconductor chip thereon at the first end thereof; and a third metal layer joined to the bottom surface of said second metal layer.

11. The lead frame according to claim 10, wherein said first and third metal layers are made of alloy-42 (42% Ni), while said second metal layer is made of copper.

12. The lead frame according to claim 10, wherein said first and third metal layers are made of copper, while said second metal layer is made of alloy-42 (42% Ni).

* * * * *